(12) United States Patent
Gupta et al.

(10) Patent No.: US 12,418,292 B1
(45) Date of Patent: Sep. 16, 2025

(54) FAIL TOLERANT PAD SENSOR CIRCUIT

(71) Applicant: Synopsys, Inc., Mountain View, CA (US)

(72) Inventors: Rahul Gupta, Haryana (IN); Nitin Bansal, Gurgaon (IN); Akhil Thotli, Andhra Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 210 days.

(21) Appl. No.: 18/217,463

(22) Filed: Jun. 30, 2023

Related U.S. Application Data

(60) Provisional application No. 63/358,068, filed on Jul. 1, 2022.

(51) Int. Cl.
*H03K 19/0185* (2006.01)
*H03K 3/037* (2006.01)
*H03K 19/003* (2006.01)

(52) U.S. Cl.
CPC ... *H03K 19/018521* (2013.01); *H03K 3/0377* (2013.01); *H03K 19/00315* (2013.01)

(58) Field of Classification Search
CPC ..... H03K 19/018521; H03K 19/00315; H03K 3/012; H03K 3/356113; H03K 17/08122; H03K 19/1737; H03K 3/356086; H03K 3/356104; H03K 3/3565; H03K 19/017509; H03K 5/02; H03K 19/018557; H03K 3/356165; H03F 3/45179; H03F 1/3205; H03F 3/505; H03F 2203/5012; H03F 3/45183; H03F 1/3211; H03F 1/56; H03F 2200/411; H03F 2203/30084; H03F 2203/30117; H03F 2203/45394; H03F 2203/45648; H03F 2203/45668; H03F 2203/45682; H03F 3/195; H03F 3/3022
See application file for complete search history.

(56) References Cited

U.S. PATENT DOCUMENTS

| | | | | |
|---|---|---|---|---|
| 6,501,318 | B1 * | 12/2002 | Randazzo | H03K 19/00315 327/309 |
| 2006/0091907 | A1 * | 5/2006 | Khan | H03K 3/356113 326/81 |
| 2021/0249855 | A1 * | 8/2021 | Whitney | H03K 19/00315 |
| 2021/0279197 | A1 * | 9/2021 | Hamlyn | H10D 84/85 |

* cited by examiner

*Primary Examiner* — Lincoln D Donovan
*Assistant Examiner* — Tyler J Pereny
(74) *Attorney, Agent, or Firm* — Andrew L. Dunlap; Haynes Beffel & Wolfeld LLP

(57) ABSTRACT

A fail tolerant sensor circuit for adjusting an input signal received at an input pad to be provided to an integrated circuit (IC). The circuit includes a sensor input transistor including a first terminal coupled to the input pad, a second terminal coupled to a receiver circuit, and a gate. The circuit further includes a feedback loop that includes a first voltage clamp circuit having an input coupled to the second terminal of the senor input transistor and providing an output, and a first level shifter including an input coupled to the output of the first voltage clamp circuit and providing the feedback output coupled to the gate of the sensor input transistor.

19 Claims, 10 Drawing Sheets

FAIL TOLERANT PAD SENSOR CIRCUIT

RELATED APPLICATION

This application claims priority to U.S. Provisional Application No. 63/358,068, filed on Jul. 1, 2022, and titled "Fail Tolerant Receiver", the contents of which are incorporated by reference herein.

TECHNICAL FIELD

The present disclosure generally relates to an integrated circuit (IC) design. In particular, the present disclosure relates a pad sensor circuit.

BACKGROUND

Peripheral circuits interact with ICs (e.g., chips) that receive signals from the peripheral circuits provided at an input pad of the IC. The received signals can operate at different voltages. Sometimes the voltages of the peripheral circuits are different from voltages expected by the ICs. These varying or different voltages can be more than the safe or desired operating voltages of, for example, thick gate oxide devices. In some lower technology nodes (e.g., gate oxide devices having a gate length of 7 nm and below), a gate oxide breakdown limit places a limit on the operating voltages applied across any two terminals of the devices (e.g., a gate oxide device having a gate length of 7 nm can sustain a voltage of 1.8 volts; and a gate oxide device having a gate length of 5 nm can sustain an operating voltage of 1.5 volts).

SUMMARY

A method and system provide a fail tolerant input pad sensor circuit for adjusting an input signal received at the input pad to be provided to an integrated circuit (IC) that includes a receive transistor within a specific voltage threshold.

In an embodiment, the system is provided that can include an input pad that receives an input signal for an integrated circuit (IC) that includes a receive transistor. The system includes a sensor circuit configured to receive the input signal from the input pad and to generate a signal that mimics a waveform of the received input signal, wherein the generated signal has different voltage levels than the received input signal, such that the generated signal remains within a specific voltage threshold, the generated signal being applied to a gate of the receive transistor. The sensor circuit includes the following components: (i) a sensor input transistor including a first terminal coupled to the input pad, a second terminal coupled to a gate of the receive transistor in a receiver circuit of the IC, and a gate; (ii) a first voltage clamp including an input coupled to the second terminal of the sensor input transistor and providing an output; and (iii) a first level shifter including an input coupled to the output of the first voltage clamp and providing a feedback output coupled to the gate of the sensor input transistor.

In a further embodiment, the system sensor circuit includes a multiplexer input transistor and a multiplexer. The multiplexer input transistor includes a source to drain path with a first terminal coupled to the input pad, a second terminal coupled to the first terminal to the sensor input transistor, and a gate. The multiplexer includes a first terminal coupled to the feedback output of the first level shifter, a second terminal coupled between (i) the source to drain path of the sensor input transistor and (ii) the source to drain path of the multiplexer input transistor, and a third terminal connected to the gate of the multiplexer input transistor.

In a further embodiment, the system sensor circuit includes a Vt booster circuit including an input connected to the input pad and including an output connected to the second terminal of the multiplexer, the Vt booster circuit generating a Vt drop based on an input signal received on the input pad and a supply voltage of the circuit being within a tolerance of one another.

In a further embodiment, the system includes an RX connection circuit coupling the sensor input transistor to the gate of the receive transistor in a receiver circuit. The RX connection circuit includes: a Schmitt trigger including an input connected between the sensor input transistor and the first voltage clamp, and including an output; a second voltage clamp including an input coupled to the output of the Schmitt trigger and including an output; and a second level shifter including an input coupled to the output of the second voltage clamp and including an output coupled to the gate of the receive transistor in the receiver circuit.

In an embodiment, the method is provided that protects IC components connected to an input pad. The method includes receiving, on the input pad, an input signal provided for the IC that includes a receive transistor, and generating, by a sensor circuit, a signal that mimics a waveform of the received input signal, wherein the generated signal has different voltage levels than the received input signal, such that the generated signal remains within a specific voltage threshold by using a feedback signal received by the sensor circuit, the feedback signal being provided to a gate of a sensor input transistor of the sensor circuit through a voltage clamp and a level shifter of the sensor circuit, and the feedback signal adjusting a voltage at the gate of the sensor input transistor to prevent overvoltage conditions across a source to drain of the sensor input transistor, and providing the generated signal from the sensor circuit to a gate of the receive transistor in the receiver circuit.

In a further embodiment, the method includes providing, with a multiplexer circuit and multiplexer input transistor connected in series with the sensor input transistor that form an additional part of the sensor circuit, an additional voltage variation to the gates of the sensor input transistor and the multiplexer input transistor when an IC supply voltage and a voltage on the input pad are within a tolerance of one another.

In a further embodiment, the method includes generating, using a Vt booster circuit provided as part of the sensor circuit and connected to the input pad, a Vt voltage lost through the multiplexer input transistor when the voltage on the input pad and the IC supply voltage are within a tolerance of one another.

In a further embodiment, the method includes providing, using a receive RX connection circuit connecting the sensor circuit to the receive transistor, a reduced voltage range output to the receiver circuit, the receive RX connection circuit including a Schmitt trigger, a voltage clamp and a level shifter that connect the sensor input transistor to the receiver circuit.

In an embodiment, a non-transitory computer readable medium is provided having stored instructions, which when executed by a processor, cause the processor to: (i) receive, on an input pad, an input signal provided to an integrated circuit (IC) that includes a receive transistor; (ii) generate, by a sensor circuit, a signal that mimics a waveform of the received input signal, wherein the generated signal has different voltage levels than the received input signal, such that the generated signal remains within a specific voltage threshold by using a feedback signal received by sensor circuit, the feedback signal being provided to a gate of a sensor input transistor of the sensor circuit through a voltage clamp and a level shifter of the sensor circuit and the feedback signal adjusting a voltage at the gate of the sensor input transistor to prevent overvoltage conditions across a source to drain of the sensor input transistor; and (iii) provide the generated signal from the sensor input transistor to the receiver circuit.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1A:
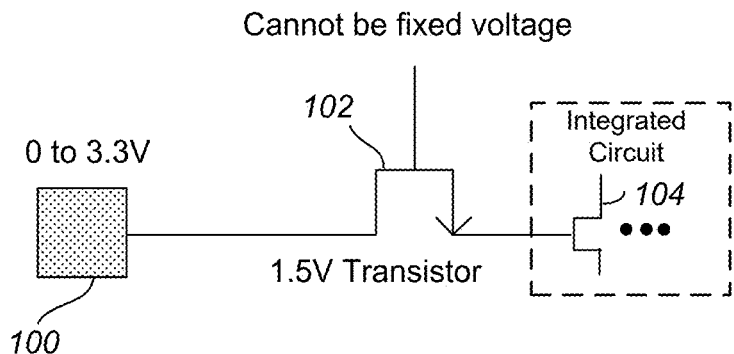
FIGS. 1A, 1B and 1C shows potential voltages on a sensor input transistor that connects the input pad to the gate of an internal receive IC transistor.

Aspects of the present disclosure relate to fail tolerant sensor circuits connecting an input pad (e.g., a contact point that receives an electrical input) of an integrated circuit (IC) to internal input-output (IO) components of the IC. Aspects include a fail tolerant sensor circuit provided for adjusting an input signal received at an input pad to be provided to an internal IC receive transistor within a specific voltage threshold to prevent overvoltage conditions on the IC receive transistor. More particularly, aspects include circuitry that connects an input pad (e.g., a contact point that receives an electrical input) to internal components on an IC chip to enable voltages provided at the input pad to be converted and safely applied to the IC chip components to prevent chip failure.

The fail tolerant sensor circuit that can accomplish this fail tolerant operation can include a sensor input transistor connecting the input pad to a gate of the receive transistor of the IC along with feedback components provided between the sensor input transistor source to drain and the sensor input transistor gate. The feedback components include a first voltage clamp and a first level shifter. The fail tolerant sensor circuit in further embodiments can include a multiplexer circuit and a voltage threshold (Vt) booster circuit described in detail herein. Further a receive RX connection circuit can be provided to connect the sensor circuit to the gate of the receive transistor in the IC.

The different types of IO environments that the input pad connects to internal IC components can be placed into, at least, three categories. The categories include (i) normal voltage IOs (i.e., normal voltage mode), where the input pad voltage (i.e., the voltage coming into the device), the operating supply voltage and the safe operating voltage of the thick gate device connected to the input pad are the same, (ii) high voltage IOs (e.g., high voltage mode), where the input pad voltage and the operating supply voltage are higher than the safe operating voltage of the thick gate device connected to the input pad and (iii) tolerant voltage IOs (e.g., tolerant voltage mode), where the operating supply voltage is higher than the safe operating voltage of the thick gate device connected to the input pad, and where the input pad voltage is higher than the operating supply voltage. This sets the need of different types of input and output (IO) components within an IC connected to an input pad based on the voltages of received external signals and a safe operating voltage of thick gate devices making up the IO components.

There can be one or more problems associated with the implementation of tolerant voltage IOs, where the input pad voltage can ramp up to 3.3V, the operating supply voltage on the chip is 2.5V, and the safe operating voltage of the thick gate transistor device is 1.5V.

Operating frequency for voltage tolerant IOs can further be difficult to account for because a high voltage signal received at the input pad can be received at a full data rate (e.g., the operating frequency of a receiver in a normal mode, such as for example 100 MHz). Voltage fault safety features should, therefore, be implemented without compromising the performance (e.g., not changing the desired or preferred duty cycle of the received signal) and ensuring the reliability of the design of the IC throughout the end of the life of the IC.

Applying the fixed gate voltage to transistors connecting the input pad to internal transistors when the voltage swing at the input pad widely varies can lead to device stress on an n-type metal oxide semiconductor (NMOS) transistor. The reliability of the voltage tolerant IOs of an IC is affected when the input pad voltage is higher than the operating supply voltage of the IC. For example, while receiving a 3.3V swing signal, a NMOS transistor can sustain up to a 1.5V voltage across its terminal and the 1.5V range can be accidentally exceeded stressing the NMOS transistor.

Figure 1B:
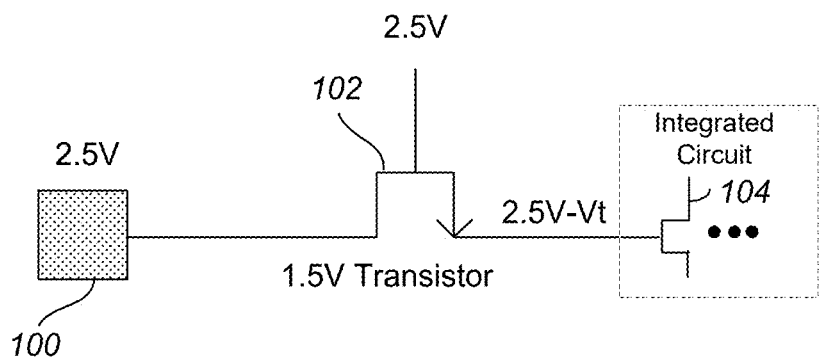
Figure 1C:
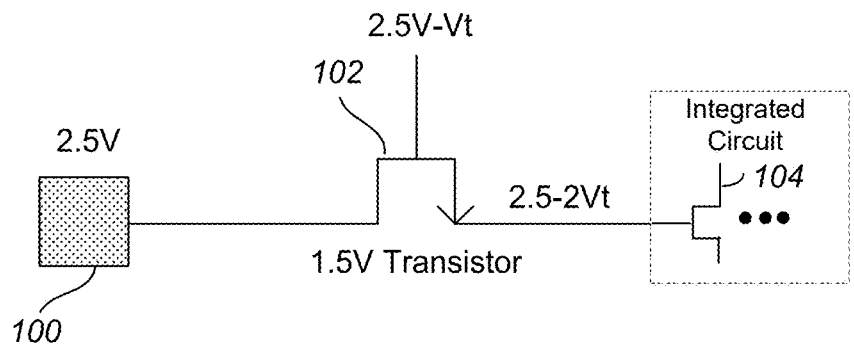

FIGS. 1A, 1B and 1C show potential voltages on a sensor input transistor 102 that connects an input pad 100 to a gate of an internal IC component 104 (e.g. an IC receive transistor) on a chip with a voltage controlled to be within tolerance of the receive transistor 104. FIG. 1A illustrates a problem of a voltage swing from 0V to 3.3V on the input pad 100 necessitating a voltage be applied to a gate of the sensor input transistor 102 that is high enough to prevent damage to the sensor input transistor 102, which can be an NMOS transistor that is designed to receive a maximum input of 1.5V or less (e.g., hereinafter referred to as a 1.5V transistor, as the 1.5V transistor label is illustrated in FIG. 1A, as well as other figures). A gate voltage of the sensor input transistor 102 must also be low enough to enable the voltage on the input pad 100 to be transferred to transistors, such as receive transistor 104 of the IC, when the voltage on the input pad 100 is far below 3.3 volts but still represents a high voltage value. As shown in FIG. 1A, the voltage on the input pad 100 can range from 0 to 3.3V, but the high voltage level can be 1.5 volts or less rather than the extreme of 3.3 volts. To avoid stressing the 1.5V sensor input transistor 102 while still allowing the voltage on the input pad 100 to be transferred, even at the high of 3.3 volts, the gate voltage of the sensor input transistor 102 cannot be fixed. Thus, FIG. 1A illustrates that a fixed voltage cannot be applied to the gate of the sensor input transistor 102 without undesirable results.

The problem illustrated with FIG. 1A can be remedied by generating a voltage in dependence on sensing the voltage on the input pad 100 (0 to 3.3V) and adjusting the gate voltage of the sensor input transistor 102 accordingly. The sensing can be performed using a sensor circuit according to embodiments of the present disclosure.

With respect to performance, in the normal voltage IO scenario where a maximum voltage on the input pad 100 is the same as the operating supply voltage of the IC, the maximum available voltage which can be applied at the gate of the sensor input transistor 102 is 2.5V. This will lead to a threshold voltage (Vt) drop across the sensor input transistor 102, creating a 2.5V-Vt (2.5V minus Vt) voltage at the output of the source to drain path of the sensor input transistor 102. This is illustrated in FIG. 1B.

FIG. 1C further shows an additional voltage drop that can occur due to a sensor circuit that provides the variable feedback voltage to the gate of the sensor input transistor 102. The sensor circuit can have an additional fundamental limitation of a voltage threshold (Vt) drop occurring when the gate voltage on the sensor input transistor 102 and the voltage on the input pad 100 are the same. The sensor circuit can, in an embodiment, include feedback circuit components connecting to the gate of the sensor input transistor 102 providing an additional Vt voltage drop so that the voltage on the gate of the sensor input transistor 102 is 2.5V-Vt. With 2.5V-Vt applied to the gate of the sensor input transistor 102, the voltage drop across the source to drain of the sensor input transistor 102 can still be 2.5V-2Vt as shown in FIG. 1C.

When the voltage at the source to drain path output of the sensor input transistor 102 is reduced by 2Vt due to the voltage applied to the gate of the sensor input transistor 102, the total voltage level applied to the gate of an internal IC transistor 104 can be lower than VIH, which is the input high threshold of the internal IC transistor 104 which can cause a failure of the IC receiver transistor 104. Therefore, embodiments described herein provide a solution to prevent failure of the IC receiver transistor 104. Embodiments of a sensor circuit that control the gate voltage on the sensor input transistor 102 can (i) sense the input voltage at the input pad 100 and generate the feedback gate voltage for the sensor input transistor 102 so that it can dynamically adjust its level as per voltage on the input pad 100 and eliminate reliability concerns in the tolerant mode of operation and (ii) ensure that there is no degradation in transient performance of the receiver transistor 104 in the IC during a normal mode of operation.

Specifically, the embodiments disclosed herein provide (i) a dynamic sensor circuit which can sense the input voltage on the input pad 100 at a full data rate and adjust the gate voltage of the sensor input transistor 102 receiving the input data signal at the input pad 100, (ii) a Vt boosting circuit provided as part of the sensor circuit that can recover the Vt drop that can happen across the source to drain path of the sensor input transistor 102, and (iii) a multiplexer, level shifters and other components provided in the dynamic sensor circuit that enhance the performance of the sensor circuit.

The circuit topology is described for the embodiments presented herein which can be used to implement the fail tolerant sensor design which is in high demand as IC components become smaller and operate at lower voltages. The present circuit topology does not consume static power from either the input pad 100 or the operating supply voltage of the IC, so it can also receive the full data rate signal which can be 100 MHz tolerant in a normal mode of operation. Note that although numbers are indicated for such items as supply voltage, input pad voltage, safe voltage limits and frequency herein, these numbers are for illustration purposes only, and other values could be used within the knowledge of a person of ordinary skill.

FIGS. 2-8 show components of a sensor circuit in accordance with embodiments disclosed herein. For a voltage tolerant sensor circuit, example circuits are illustrated in FIGS. 2-8, but the specific details and implementation are merely exemplary. Even if the implementation is varied, it should still be considered within the scope of this disclosure.

A goal for the sensor circuits of FIGS. 2-8 is to generate a signal which can follow or mimic the signal (waveform) on the input pad 100 but with a different voltage level, which can then be applied to the gate of the receive transistor 104 of the IC such that the receive transistor 104 is mitigated from stress. In other words, the sensor circuit is designed to generate a signal that mimics the signal on input pad 100, but the signal generated by the sensor circuit has lower voltage levels, so that the IC receive transistor 104 that receives the signal generated by the sensor circuit is not damaged by receiving too high of a voltage. The sensor circuit can be designed to essentially scale down the voltage from the input pad 100 while also not damaging (e.g., NMOS) transistors in the sensor circuit, such as the sensor input transistor 102, when scaling down high voltages from the input pad 100. The amount of "scaling down" can be configured based on the characteristics of the (e.g., NMOS) transistors in the sensor circuit, such as the sensor input transistor 102. Redundant descriptions of reference elements that are described in FIGS. 1A, 1B and 1C are omitted in the descriptions of FIGS. 2-7 provided below.

Figure 2:
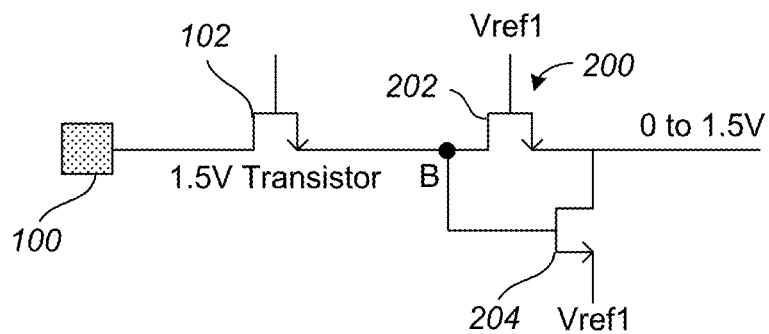
FIG. 2 shows components of a first voltage clamp that follows the sensor input transistor in the sensor circuit in embodiments described to provide for fail tolerant operation.

FIG. 2 shows components of a first voltage clamp circuit 200 to be provided in the sensor circuit that follows the sensor input transistor 102 in embodiments described to provide for fail tolerant operation. The first voltage clamp circuit 200 is added after the sensor input transistor 102 at node B to clamp the high signal up to a 1.5V level so that the sensor circuitry following the first voltage clamp circuit 200 can handle the voltage transitions. The first voltage clamp circuit 200 includes a first voltage clamp transistor 202 and a second voltage clamp transistor 204. The gate of the first voltage clamp transistor 202 is connected to a voltage reference Vref1 which is a power supply reference provided within the IC chip. In embodiments described herein Vref1 can be set at 1.5 volts. Transistor 202 has a source to drain path connecting the source to drain path of the sensor input transistor 102 to subsequent circuitry in the sensor circuit. The second voltage clamp transistor 204 has a source drain path connecting the voltage reference Vref1 to the drain of transistor 202, while the gate of transistor 204 is connected to the source of transistor 202. The output of the first voltage clamp circuit 200 ranges from 0 to 1.5V as shown with the reference Vref1 set at 1.5 volts.

Figure 3:
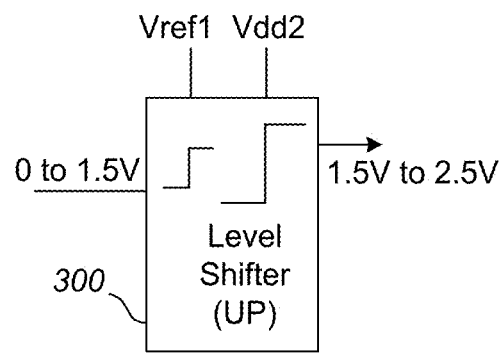
FIG. 3 shows a block diagram of a level shifter included in feedback provided in the sensor circuit according to embodiments.

FIG. 3 shows a block diagram of a level shifter 300 that can further be added after the first voltage clamp circuit 200 in the feedback path of the sensor circuit as included in embodiments of the present invention. The level shifter 300 shown receives the 0 to 1.5 volt output of the first voltage clamp circuit 200 and up-shifts the voltage level to 1.5 to 2.5 volts to apply to the gate of the sensor input transistor 102. The level shifter 300 can receive two supply voltages, a first Vref1, which can be set at 1.5V and a second Vdd2, which can be set at 2.5V according to embodiments described herein.

Figure 4:
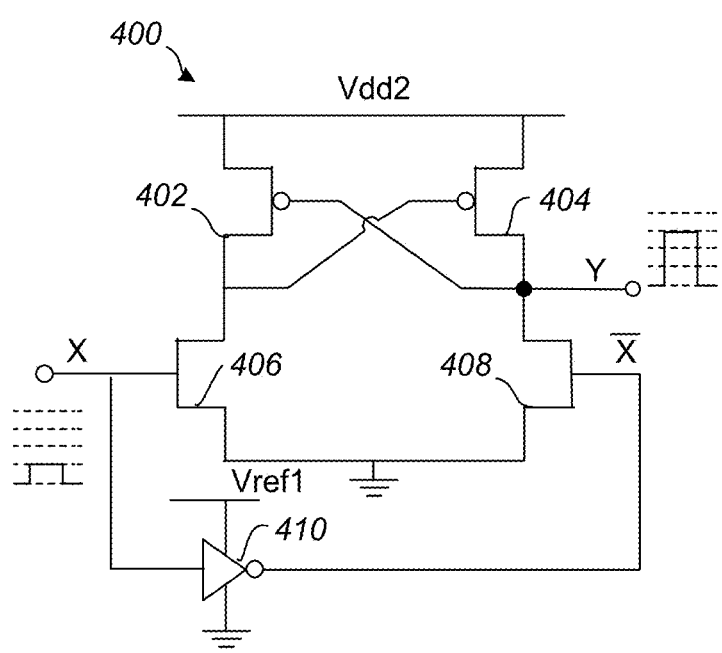
FIG. 4 shows one embodiment of circuitry for the level shifter of FIG. 3.

FIG. 4 shows exemplary components for a cascoded level shifter 300 of FIG. 3. Although an exemplary cascoded level shifter 400 shown in FIG. 4 is understood to be an example as other level shifter circuits can be used with embodiments described herein. The circuit of FIG. 4 includes two cascode connected PMOS transistors 402 and 404. The PMOS transistors 402 and 404 connect the power supply Vdd2, which can be set to 2.5 volts, and also connect to the source to drain path of NMOS transistors 406 and 408. The NMOS transistor 406 has a gate receiving the level shifter input X which ranges from 0 to 1.5 volts, and the gate of NMOS transistor 408 receives the inverse of input X through inverter 410. The inverter 410 is powered by the supply voltage Vref1 which can be set at 1.5V. The output Y of the level shifter 300 is provided from the PMOS transistors 402 and 404. The output Y is upshifted from 0 to 1.5 volt range of input X to a range of 1.5 to 2.5 volts.

Figure 5:
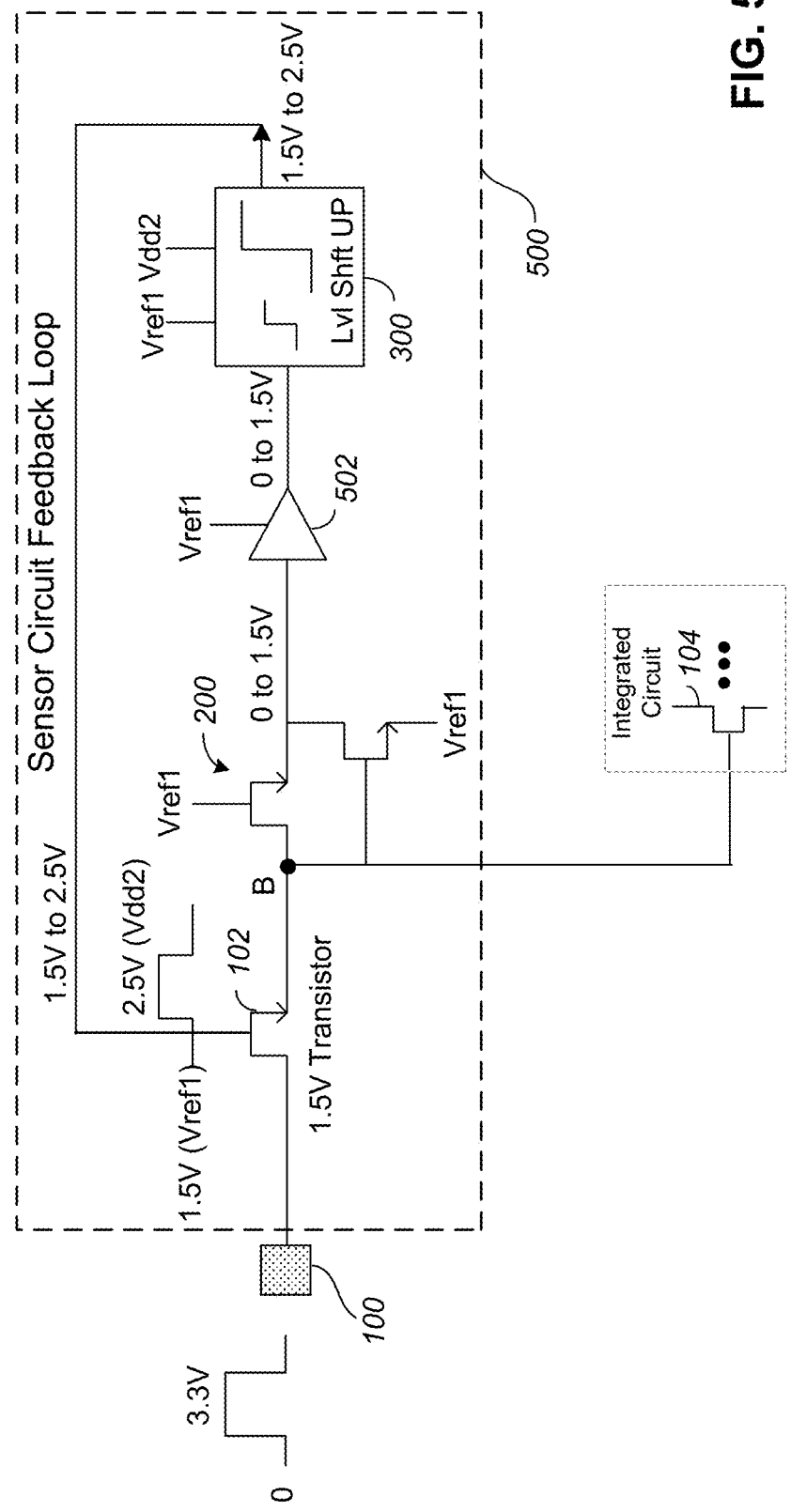
FIG. 5 shows one embodiment of components of a complete sensor circuit.

FIG. 5 shows one embodiment of a set of components for a feedback loop circuit 500 of the sensor circuit. As shown in FIG. 5, the feedback loop circuit 500 includes the sensor input transistor 102 from previous figures. The sensor input transistor 102 connects to the input pad 100 and is followed by the first voltage clamp circuit 200. The output of the first voltage clamp circuit 200 is provided to level shifter 300. The output of the level shifter 300 is then provided as feedback to the gate of the sensor input transistor 102.

The input pad 100 can receive inputs with voltages that are slowly ramped up and down. The threshold of components of the feedback loop circuit 500 of the sensor circuit, such as the first voltage clamp circuit 200 and level shifter 300, can be set such that the components should not see any stress during a slow ramp up and ramp down of the input signal. Similarly, the threshold of these components can be set, so as to not incur stress during a rapid ramp up and ramp down of the input signal. A buffer 502 may be inserted between the first voltage clamp circuit 200 and the level shifter 300 to control the ramping of voltage provided to the level shifter 300 to temper ramping of voltage to form a complete sensor circuit in one embodiment. In another embodiment, the drain of the first voltage clamp circuit 200 is directly connected to the level shifter 300. The output of the sensor circuit in this embodiment is provided from node B that is connected to a gate of the receive transistor 104 in the IC.

Figure 6:
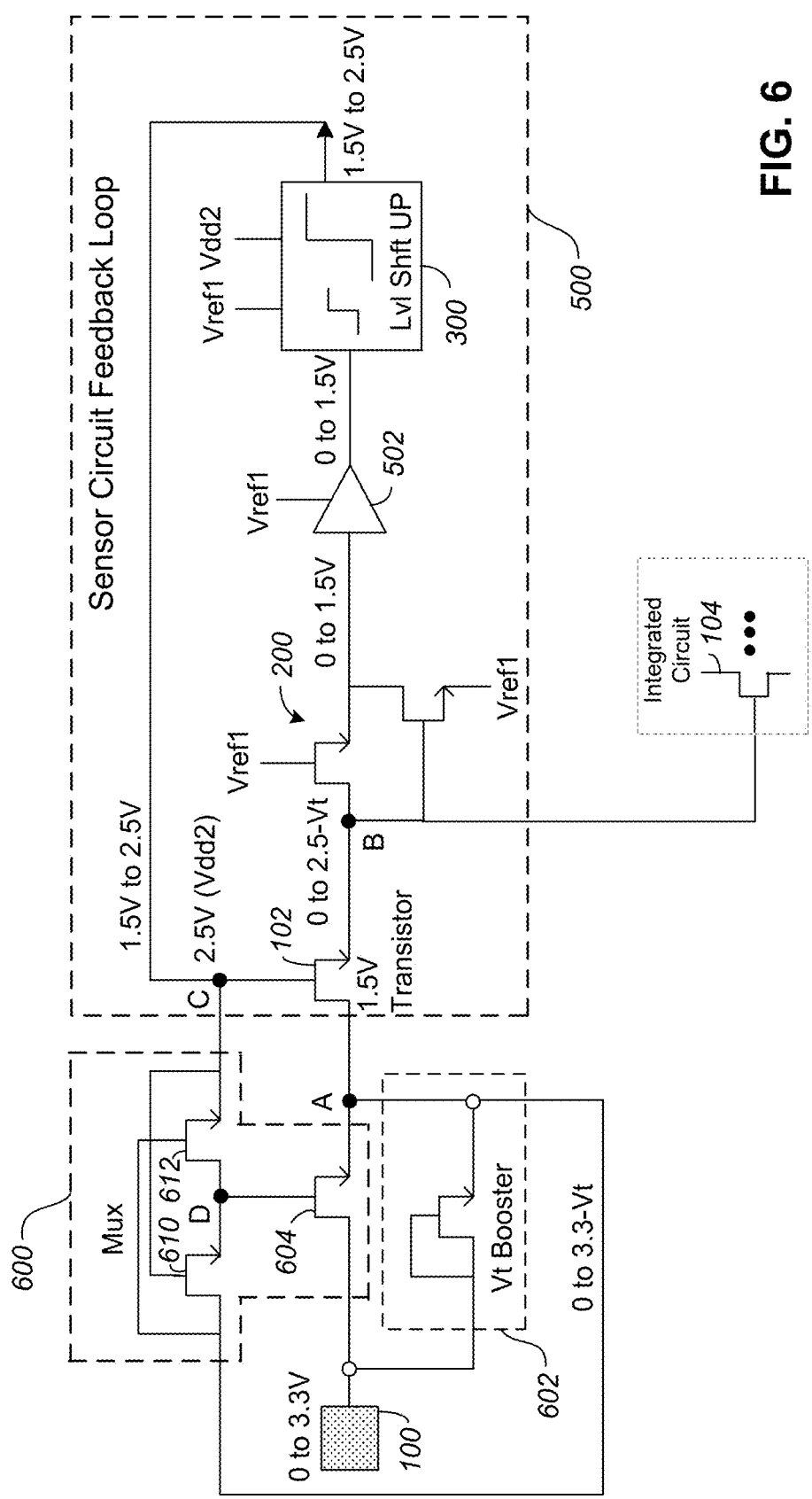
FIG. 6 shows an embodiment with additional components of a sensor circuit, including the components of FIG. 5 along with a multiplexer circuit and a Vt booster circuit.

FIG. 6 shows an embodiment with components that can be added to the sensor circuit to enhance performance, including a multiplexer circuit 600 with a multiplexer input transistor 604 and a Vt booster circuit 602. First, an operation of the added multiplexer circuit 600 will be described.

The multiplexer circuit 600 can be added to prevent stress to sensor input transistor 102 when the voltage on the input pad 100 is slightly above the voltage of the IC power supply Vdd2 to the point that a drain to source voltage of the sensor input transistor 102 exceeds 1.5V which may stress the sensor input transistor 102. The voltages on input pad 100 and internal supply voltages (Vdd2 and Vref1 shown) are normally uncorrelated, so in one example it can happen that the input voltage is 3.63V and the Vdd2 maximum less a Vt drop applied to the gate of transistor 102 is 2.25V. In such a scenario example, the input to the sensor input transistor 102 will see a drain to source voltage (Vds) stress. (Note that Vds at this voltage point is approximately 1.78V (3.63V−(2.25-Vt)), which is higher than the safe limit of 1.5V).

The multiplexer circuit 600 enables a safe tolerant mode of operation when the voltage on the input pad 100 is higher than supply voltage Vdd2. In the normal mode of operation, the voltage on input pad 100 and the supply voltage Vdd2 are the same. The multiplexer circuit 600 will start adding the additional Vt drop back to the gate of the first sensor input transistor 102 when the voltage on the input pad 100 and the supply voltage Vdd2 approach the same voltage level.

The multiplexer circuit 600 of FIG. 6 includes (e.g., NMOS) transistors 610 and 612 (e.g., a first transistor 610 and a second transistor 612). Further, the multiplexer circuit 600 includes a multiplexer input transistor 604 with a source to drain path in series with the source drain path of the sensor input transistor 102. The gate of the multiplexer input transistor 604 is controlled by transistors 610 and 612 of the multiplexer circuit 600.

For the multiplexer circuit 600, transistor 612 has a source to drain path connecting the feedback from the sensor circuit at node C at the gate of sensor input transistor 102 to the gate of the multiplexer input transistor 604 at node D. The gate of transistor 612 is connected to node A at the connection of the source to drain path of the sensor input transistor 102 and the multiplexer input transistor 604. The gate of transistor 610 is connected to the sensor circuit feedback node C at the gate of sensor input transistor 102. The source to drain path of transistor 610 connects node D to node A.

The multiplexer circuit 600 can add voltage to the gate of the multiplexer input transistor 604. Voltage added at the gate of the multiplexer input transistor 604 by the multiplexer circuit 600 will start creating an additional Vt drop across the source to drain path of the multiplexer input transistor 604 because both of the multiplexer transistors 610 and 612 in the multiplexer 600 go into cutoff when both the inputs of the multiplexer circuit 600 at the gates of transistors 610 and 612 are at the same voltage level.

A Vt booster circuit 602 can be implemented to overcome this Vt drop across multiplexer input transistor 604 due to the transistors 610 and 612 that can occur in the normal mode of operation. The Vt booster circuit 602 can include a single transistor (e.g., a Vt booster transistor) having a source to drain path connecting the input pad 100 to the circuit at node A. The gate of the Vt booster transistor is also connected to the input pad 100.

Figure 7:
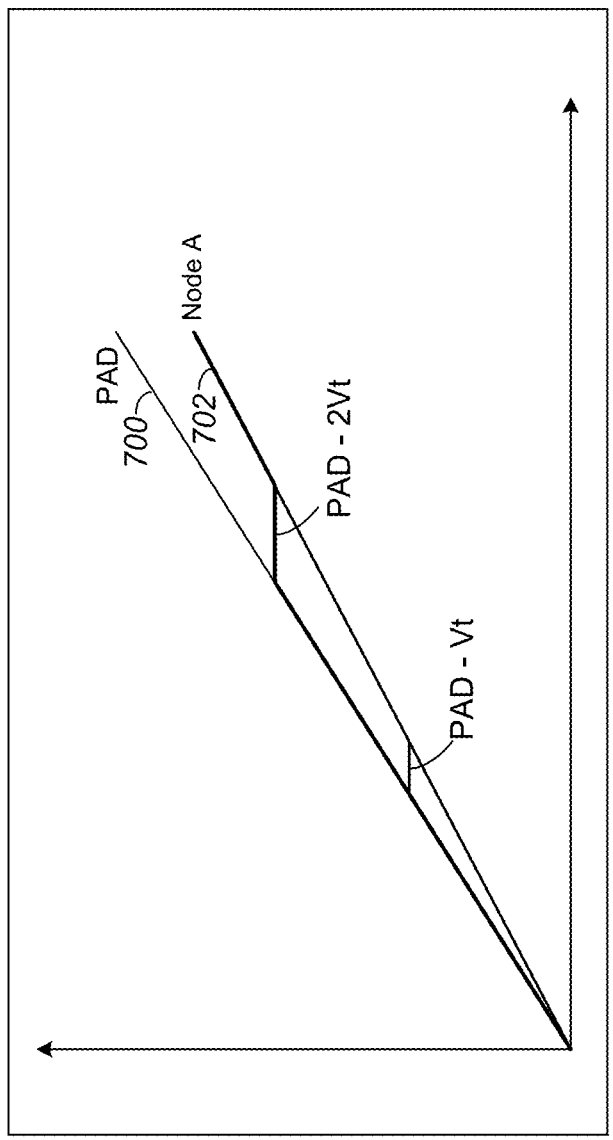
FIG. 7 provides a graph illustrating an improved ramp up of voltage over time at node A with and without the Vt booster circuit.

The Vt booster circuit 602 is added at a place which will generate the Vt drop through a parallel path with the multiplexer input transistor 604 as shown in the plot of FIG. 7. The Vt booster circuit 602 includes a Vt booster transistor connected to replace the Vt voltage drop across the multiplexer transistor 604. The plot of FIG. 7 illustrates an improved output at node A with the Vt booster circuit 602. The y-axis in FIG. 7 refers to voltage and the x-axis refers to time. When the voltage on the input pad 100 is ramping up in plot 700, without the Vt booster circuit 602, the node A voltage shown by plot 702 remains at the voltage on the input pad 100 as shown by plot 700 rather than experiencing a 1Vt drop to PAD-Vt (PAD minus Vt) as shown by the difference in plot 701 and plot 702 or even a PAD-2Vt drop as shown by the difference in plot 701 and 702. The darkened line in FIG. 7 shows the difference in the node A voltage when the Vt booster 602 is not used. The node A will actually remain at the voltage at plot 700 with the Vt booster rather than shifting down to the plot 702. With the multiplexer circuit 600 and no Vt booster circuit 602 as shown by the crossing line, the node A can experience either a 1Vt drop or a 2Vt drop from the PAD voltage (i.e., the voltage at the input pad 100) due the multiplexer circuit 600 applying voltage to the gate of the multiplexer input transistor 604.

Figure 8:
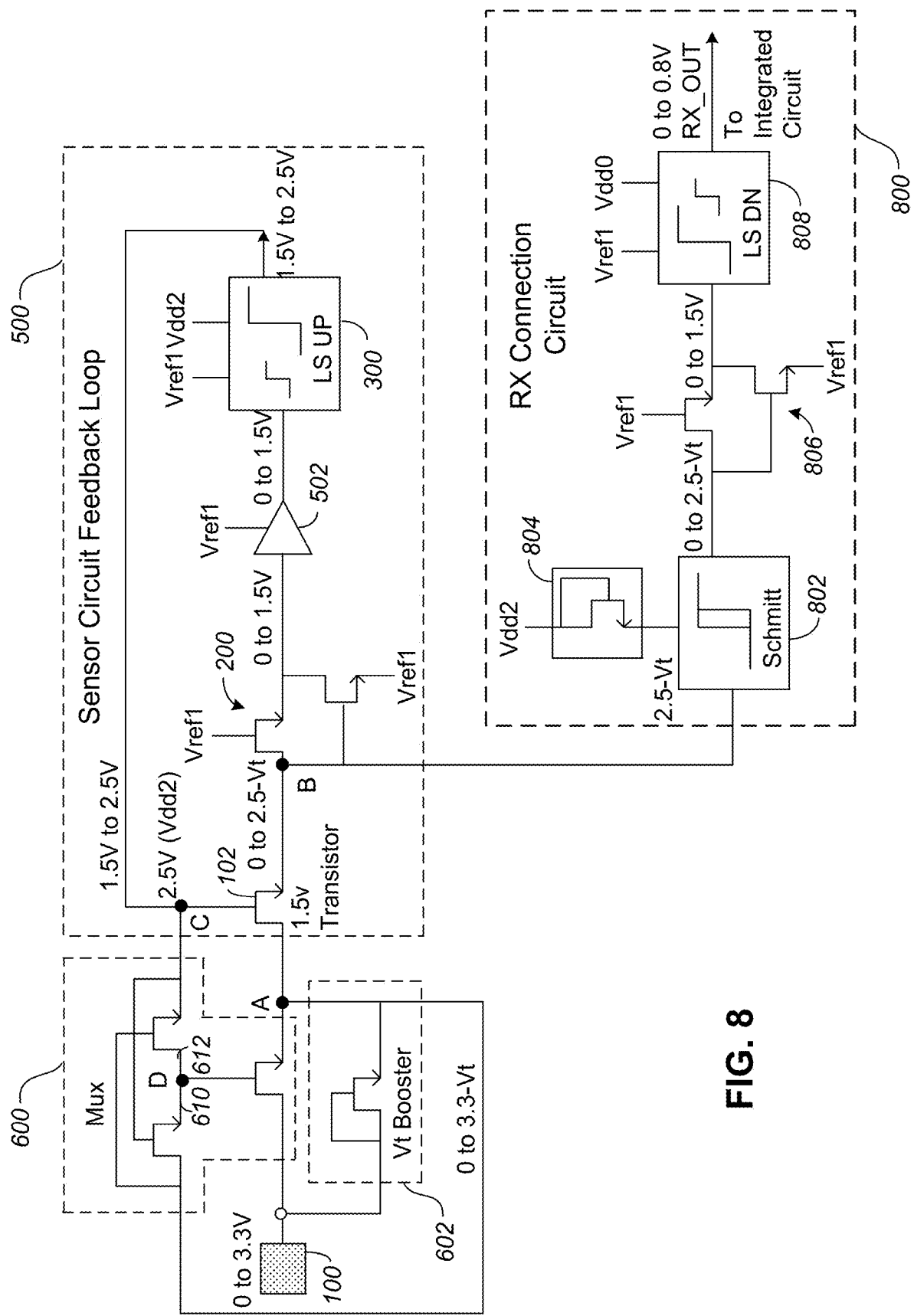
FIG. 8 shows an embodiment with additional components of a sensor circuit, including the components of FIG. 6, along with a receive RX connection circuit.

FIG. 8 shows an embodiment with components of a sensor circuit of FIG. 6 along with an added receive RX connection circuit 800. The RX connection circuit 800 serves to connect the sensor circuit output at node B to the gate of a receive transistor 104 in the IC when the receive transistor 104 is a low voltage device (i.e. less than 0.8 volts maximum). The RX connection circuit 800 includes a level shifter 808 that functions to reduce the voltage range provided to the gate of a receive transistor 104, and includes other components described to follow to improve overall transient performance. Because of the 1Vt drop experienced prior to the RX connection circuit 800, a receiver transistor 104 receiving a voltage in the range or 0 to 0.8 volts, even with compensation, can experience a transient performance degradation. With circuitry added in the RX connection circuit 800 to remove the remaining Vt drop issues, the level shifter 808 that drops the voltage down to 0.8 volts can function properly. These further components of the RX connection circuit 800 are described to follow.

In FIG. 8 the RX connection circuit 800 first includes a Schmitt trigger 802. The Schmitt trigger 802 is connected to the feedback loop circuit 500 at node B and provides hysteresis to safely switch states depending on the state of the voltage at the input pad 100. The Schmitt trigger 802 can, in one embodiment, use the IC supply voltage signal Vdd2 as provided from transistor 804. The transistor 704 provides a biasing signal Vdd2 at 2.5 volts to power the Schmitt trigger to avoid stress on its internal NMOS devices. With a voltage input to the Schmitt trigger from node B being 2.5V-Vt and 2.5 volts powering the Schmitt trigger as shown in FIG. 8, the Schmitt trigger safely provides an output at 2.5V-Vt from the signal at node B.

A second voltage clamp 806 follows the Schmitt trigger 802 in the RX connection circuit 800. The second voltage clamp 806 is connected to Vref1 which is set at 1.5 volts. With Vref1 at 1.5 volts, and the second voltage clamp 806 receiving an input from the Schmitt trigger ranging from 0 to 2.5V-Vt, the output of the second voltage clamp 806 will range from 0 to 1.5 volts. The second voltage clamp 806 includes first and second clamp transistors connected similar to the first and second clamp transistors 202 and 204 of the first voltage clamp 200 of FIG. 2.

The level shifter 808 follows the second voltage clamp 806 in the RX connection circuit 800. The level shifter 808 provides a downshift in voltage from the second voltage clamp 806, with the output of the level shifter 808 providing the final circuit output RX_OUT that is connected to the gate of a receiver transistor 104 of the IC. The level shifter 808 receives the two supply voltages Vref1 at 1.5 volts and Vdd0 at 0.8 volts. The level shifter 808 then shifts the input voltage ranging from the 0 to 1.5 volts from the second voltage clamp 806 to provide an output voltage RX_OUT ranging from 0 to 0.8 volts. The level shifter 808 further can a square wave output rather than the more gradual transition of previous circuits.

Figure 9:
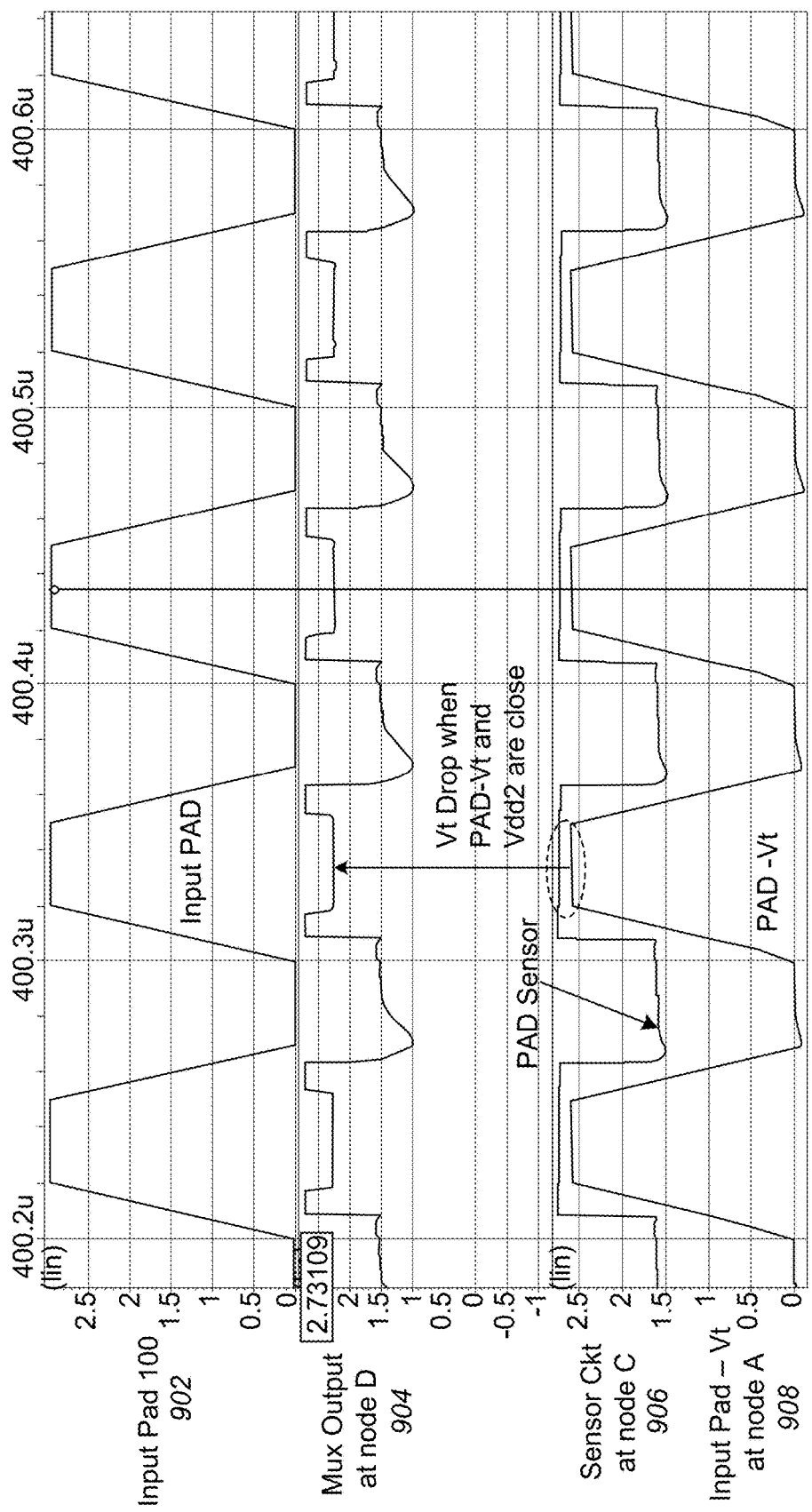
FIG. 9 provides a graph showing voltages over time at different points in the circuit of FIG. 6.

FIG. 9 provides a graph showing voltages over time at different points in the circuit of FIG. 6. For FIG. 9 and subsequent graphs, the y axis shows voltage for individual signals and the x axis shows time. The first signal 902 of FIG. 9 is an example input voltage on the input pad 100 that ranges from 0 to 3.3 volts as shown with the circuit of FIG. 6. The second signal 904 is the multiplexer output at node D at the gate of the multiplexer input transistor 604. The second signal 904 ranges from 1.5V to 3.3V-Vt. Note the Vt drop in the second signal 904, as illustrated when (i) PAD-Vt at node A provided to multiplexer transistor 610 and (ii) the supply voltage Vdd2 provided to multiplexer transistor 612 are close. Signal 906, as illustrated, is the sensor circuit feedback signal at node C. The signal 906 ranges from 1.5 to 2.5 volts. Note that signal 906 is a square wave rather than a sloping transition signal at the output of level shifter 300. Signal 908 shows the voltage at node A. Note that node A carries the voltage at the input pad 100 less 1Vt through the multiplexer input transistor 604. The voltage at node A thus ranges from 0-(3.3-Vt) volts.

Figure 10:
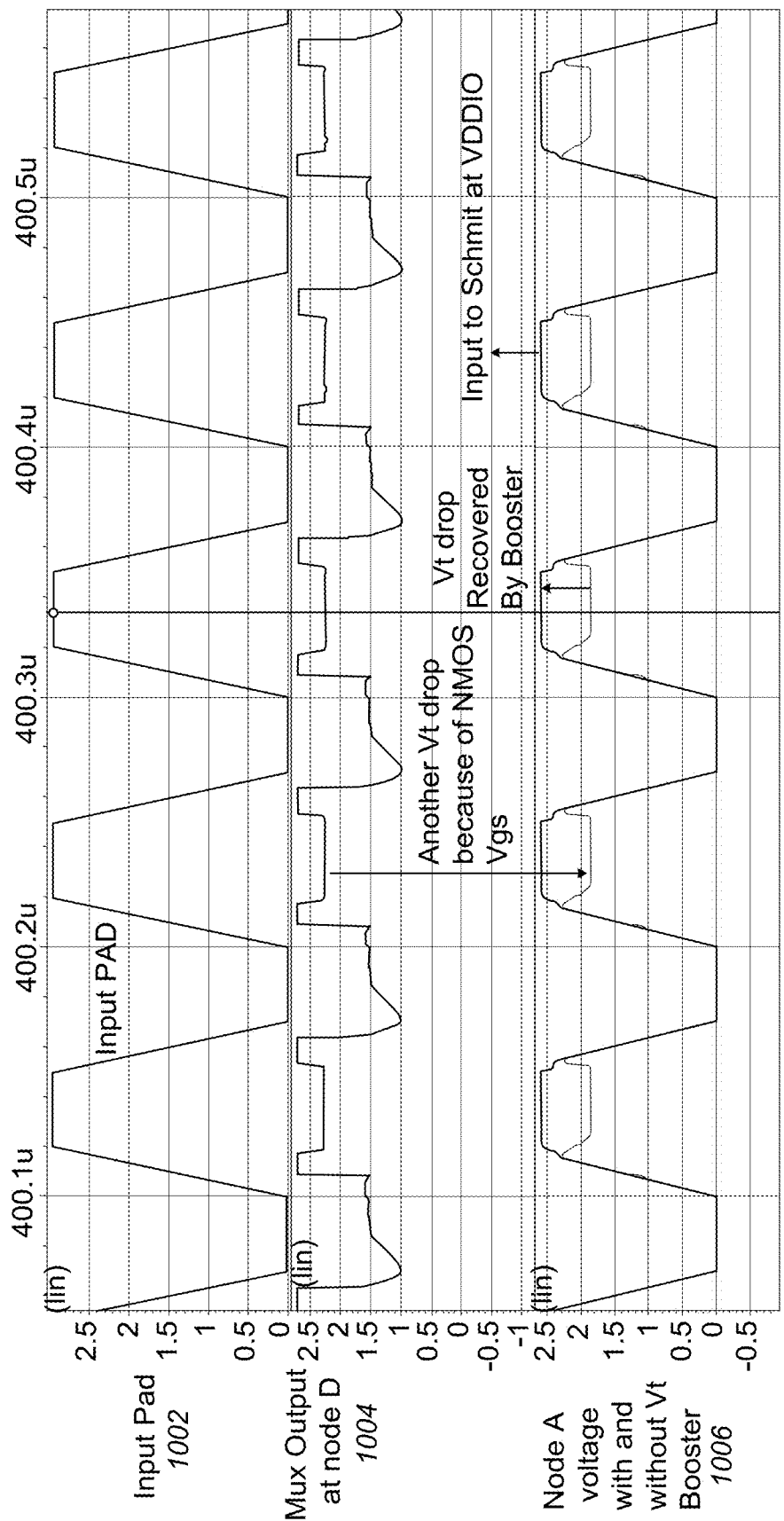
FIG. 10 provides further graphs showing voltages over time at further points in the circuit of FIG. 6.

FIG. 10, similar to FIG. 9, provides a graph showing voltages over time at different points in the circuit of FIG. 6. FIG. 10 includes a first signal 1002 at the input pad 100 which is at the same as the first signal 902 of FIG. 9. FIG. 10 further includes a second signal 1004 which is at the multiplexer output at node D at the gate of the multiplexer input transistor 604 which is the same as the second signal 904 of FIG. 9. FIG. 10 differs from FIG. 9 by including a signal 1006 which includes the voltage at node A both with and without the Vt booster circuit 602. The slight drop in voltage at the peak of signal 1006 illustrates how use of the Vt booster circuit 602 can recover the voltage drop through the multiplexer input transistor 604.

Figure 11:
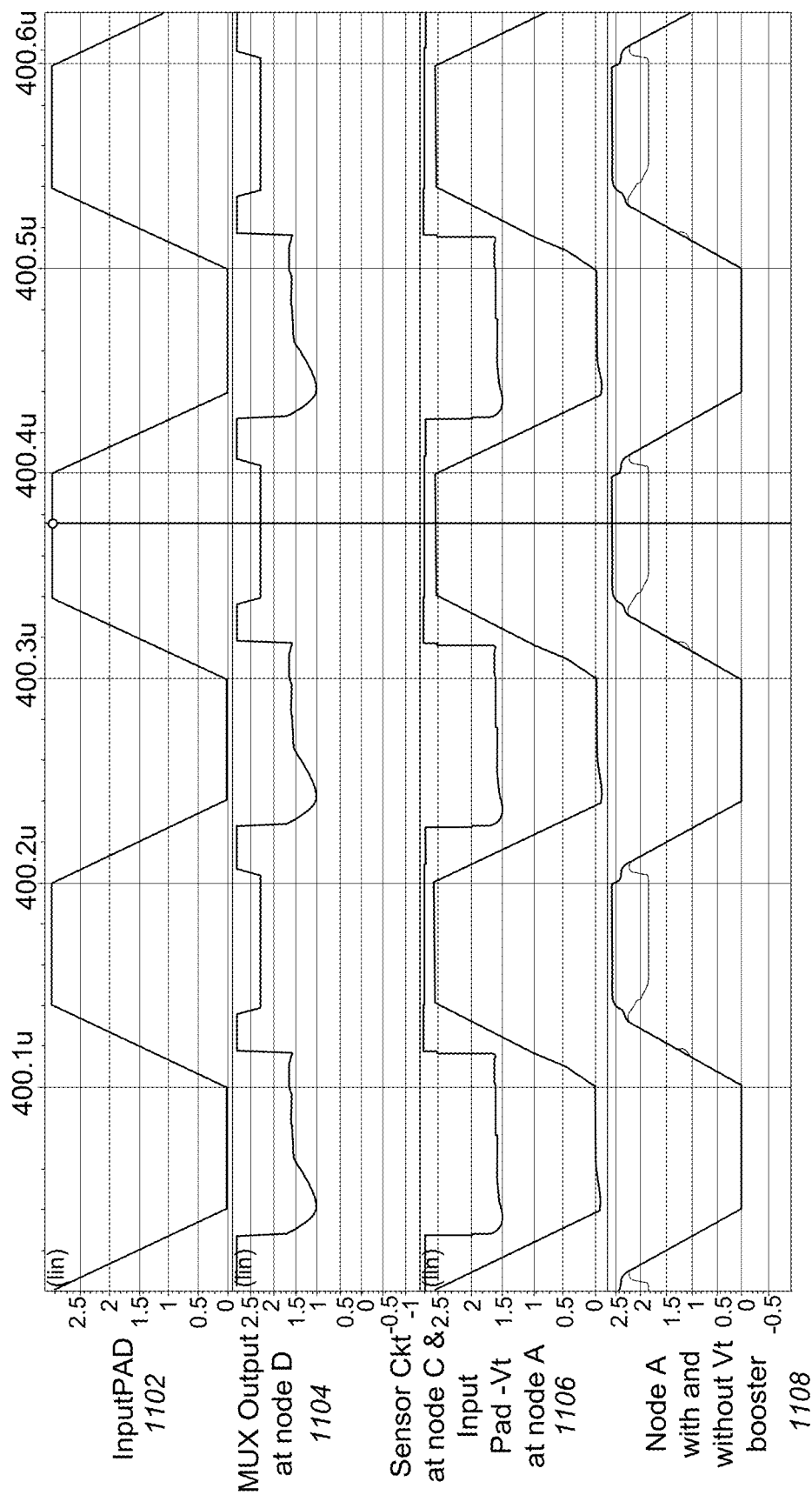
FIG. 11 provides a graph showing voltages over time at further points in the circuit of FIG. 6.

FIG. 11 provides a graph showing voltages over time including those of FIGS. 9 and 10, as well as additional voltages. The first signal 1102 is the voltage on input pad 100 which is the same as the first signal 902 of FIG. 9 and 1002 of FIG. 10. The second signal 1104 is the multiplexer output at node D at the gate of the multiplexer input transistor 604 which is the same as the second signal 904 of FIG. 9 and 1004 of FIG. 10. FIG. 11 differs from previous figures by including a comparison signal 1106 which includes the sensor circuit feedback signal at node C compared with the input PAD-Vt signal at node A. The last signal 1108 in FIG. 11, like the comparison signal 1106 of FIG. 10, includes the voltage at node A with and without the Vt booster circuit 602.

Figure 12:
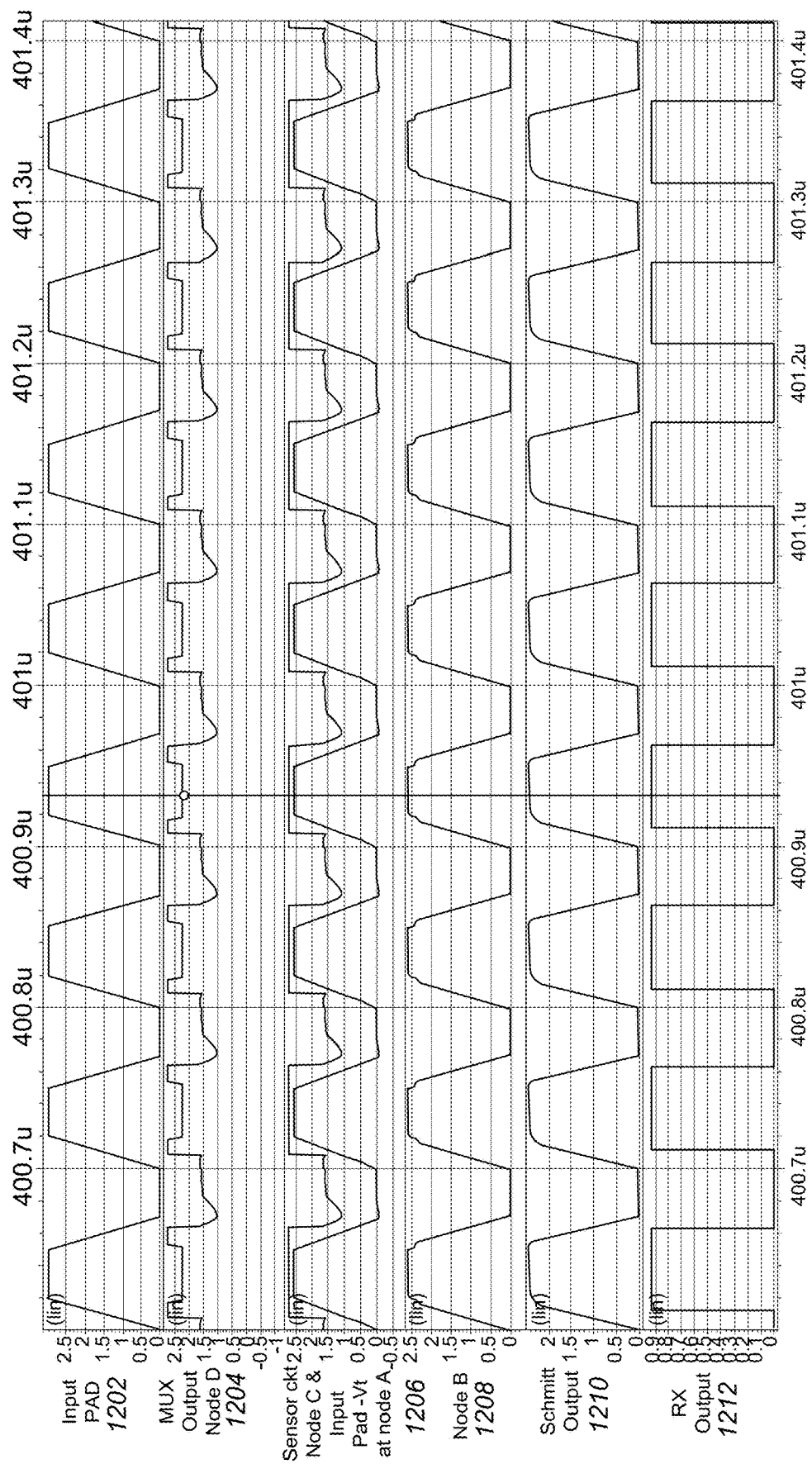
FIG. 12 provides a graph showing voltages over time at points in the circuit of FIG. 6 as well as FIG. 7.

FIG. 12 provides a graph showing voltages over time at different points in the circuits of FIG. 6 and FIG. 8, including signals from FIGS. 9-11, as well as signals at points in FIG. 8. The first signal 1202 is the voltage on input pad 100 which is the same as signals shown in FIGS. 9-11. The second signal 1204 is the multiplexer output at node D at the gate of the multiplexer input transistor 604 which is the same as similar signals shown in FIGS. 9-11. The third signal 1206 is a comparison signal which includes the sensor circuit feedback signal at node C compared with the input PAD-Vt signal at node A. The fourth signal 1208 shows the voltage at node B where the RX connection circuit 800 shown in FIG. 8 is shown connected. Further signals shown in FIG. 12 include the voltages at points in the RX connection circuit 800 of FIG. 8. The signal 1210 is the output of the Schmitt trigger 802. Signal 1212 is the RX receiver circuit output from the level shifter 808.

In some implementations of methods described herein, the instructions to implement the method are stored in a machine-readable storage medium. While the machine-readable storage medium can a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing devices connected thereto to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:
   an input pad that receives an input signal for an integrated circuit (IC); and
   a sensor circuit that comprises:
      a sensor input transistor including a first terminal coupled to the input pad, a second terminal coupled to a receiver circuit, and a gate;
      a first voltage clamp circuit including (i) a first clamp transistor comprising a first end coupled to the second terminal of the sensor input transistor, a second end providing an output, and a gate connected to a reference voltage and (ii) a second clamp transistor with a first end connected to the second end of the first clamp transistor, a second end connected to the reference voltage and a gate connected to the first end of the first clamp transistor; and
      a first level shifter including an input coupled to the second end of the first clamp transistor providing the output and providing a feedback output coupled to the gate of the sensor input transistor.

2. The circuit of claim 1, further comprising:
   a multiplexer input transistor including a source to drain path with a first terminal coupled to the input pad, a second terminal coupled to the first terminal of the sensor input transistor, and a gate; and
   a multiplexer including a first terminal coupled to the feedback output of the first level shifter, a second terminal coupled between (i) the source to drain path of the sensor input transistor and (ii) the source to drain path of the multiplexer input transistor, and a third terminal connected to the gate of the multiplexer input transistor.

3. The circuit of claim 2, wherein the multiplexer comprises:
   a first multiplexer transistor including a source to drain path with a first end coupled between the source to drain path of the sensor input transistor and the source to drain path of the multiplexer input transistor, a second end connected to the gate of the multiplexer input transistor, and including a gate coupled to the gate of the sensor input transistor; and a second multiplexer transistor including a source to drain path with a first end connected to the gate of the multiplexer input transistor, a second end connected to the gate of the sensor input transistor, and including a gate coupled between the source to drain path of the sensor input transistor and the source to drain path of the multiplexer input transistor.

4. The circuit of claim 2 wherein the sensor circuit further comprises:
a voltage threshold (Vt) booster circuit including an input connected to the input pad and including an output connected to the second terminal of the multiplexer, the Vt booster circuit generating a Vt drop based on an input signal received on the input pad and a supply voltage of the circuit being within a tolerance of one another.

5. The circuit of claim 4, wherein the Vt booster circuit comprises:
a Vt booster transistor including a source to drain path coupled between (i) the input pad and (ii) the source to drain path of the sensor input transistor and the source to drain path of the multiplexer input transistor, and including a gate coupled to the input pad.

6. The circuit of claim 1, wherein the sensor circuit further comprises: a buffer coupling the first voltage clamp circuit to the first level shifter.

7. The circuit of claim 1, wherein the first level shifter is a cascode transistor level shifter that converts from a first supply voltage to a second supply voltage that is higher than the first supply voltage.

8. The circuit of claim 1, wherein the receiver circuit further comprises:
a Schmitt trigger including an input connected between the sensor input transistor and the first voltage clamp circuit, and including an output;
a second voltage clamp including an input coupled to the output of the Schmitt trigger and including an output; and
a second level shifter including an input coupled to the output of the second voltage clamp and including an output.

9. The circuit of claim 8, wherein the second level shifter is a cascode transistor level shifter that converts from a first supply voltage to a second supply voltage that is lower than the first supply voltage.

10. The circuit of claim 8, wherein the second voltage clamp comprises:
a first clamp transistor including a source to drain path connecting the output of the Schmitt trigger to the input of the second level shifter, and including a gate connected to a first voltage reference; and
a second clamp transistor including a source to drain path connecting the input of the second level shifter to the first voltage reference, and including a gate connected to the output of the Schmitt trigger.

11. A method of protecting integrated circuit (IC) components connected to an input pad, the method comprising:
receiving, on the input pad, an input signal provided for the IC that includes a receive transistor;
generating, by a sensor circuit, a signal that mimics a waveform of the received input signal, wherein the generated signal has different voltage levels than the received input signal, such that the generated signal remains within a specific voltage threshold by using a feedback signal received by the sensor circuit, the feedback signal being provided to a gate of a sensor input transistor of the sensor circuit through a voltage clamp and a level shifter of the sensor circuit, and the feedback signal adjusting a voltage at the gate of the sensor input transistor to prevent overvoltage conditions across a source to drain of the sensor input transistor; and
providing the generated signal from the sensor circuit to a receiver circuit.

12. The method of claim 11, further comprising:
providing, with a multiplexer circuit and multiplexer input transistor connected in series with the sensor input transistor that form an additional part of the sensor circuit, an additional voltage variation to the gates of the sensor input transistor and the multiplexer input transistor when an IC supply voltage and a voltage on the input pad are within a tolerance of one another.

13. The method of claim 12, further comprising:
generating, using a Vt booster circuit provided as part of the sensor circuit and connected to the input pad, a Vt voltage lost through the multiplexer input transistor when the voltage on the input pad and the IC supply voltage are within a tolerance of one another.

14. The method of claim 13, further comprising:
providing, using a receive RX connection circuit connecting the sensor circuit to the receive transistor, a reduced voltage range output to the receiver circuit, the receive RX connection circuit including a Schmitt trigger, a voltage clamp and a level shifter that connect the sensor input transistor to the receiver circuit.

15. The method of claim 14, wherein, when a voltage on the input pad is higher than a safe operating voltage of the IC, the sensor circuit conditions a voltage applied the receiver circuit to be within the safe operating voltage of the IC.

16. A circuit comprising:
an input pad that receives an input signal for an integrated circuit (IC); and
a sensor circuit that comprises:
a sensor input transistor including a first terminal coupled to the input pad, a second terminal coupled to a receiver circuit, and a gate;
a first voltage clamp circuit including an input coupled to the second terminal of the sensor input transistor and providing an output; and
a first level shifter including an input coupled to the output of the first voltage clamp circuit and providing a generated signal that mimics a waveform of the received input signal, the generated signal having different voltage levels than the received input signal, such that the generated signal remains within a specific voltage threshold by using a feedback signal provided to the gate of the sensor input transistor for adjusting a voltage at the gate of the sensor input transistor to prevent overvoltage conditions across a source to drain of the sensor input transistor.

17. The circuit of claim 16, further comprising:
a multiplexer input transistor including a source to drain path with a first terminal coupled to the input pad, a second terminal coupled to the first terminal to the sensor input transistor, and a gate; and
a multiplexer including a first terminal coupled to the feedback signal provided by the first level shifter, a second terminal coupled between (i) the source to drain path of the sensor input transistor and (ii) the source to drain path of the multiplexer input transistor, and a third terminal connected to the gate of the multiplexer input transistor.

18. The circuit of claim 17, further comprising:
a voltage threshold (Vt) booster circuit including an input connected to the input pad and including an output connected to the second terminal of the multiplexer, the Vt booster circuit generating a Vt drop based on an input signal received on the input pad and a supply voltage of the circuit being within a tolerance of one another.

19. The circuit of claim 18, further comprising:
a Schmitt trigger including an input connected between the sensor input transistor and the first voltage clamp circuit, and including an output;
   a second voltage clamp including an input coupled to the output of the Schmitt trigger and including an output; and
   a second level shifter including an input coupled to the output of the second voltage clamp and including an output.

\* \* \* \* \*